United States Patent [19]

Robinson, Jr.

[11] Patent Number: 4,605,946

[45] Date of Patent: Aug. 12, 1986

[54] FET CHARGE SENSOR AND VOLTAGE PROBE

[75] Inventor: Paul A. Robinson, Jr., LaCanada, Calif.

[73] Assignee: The United States of America as represented by the Administrator of the National Aeronautics and Space Administration, Washington, D.C.

[21] Appl. No.: 641,146

[22] Filed: Aug. 16, 1984

[51] Int. Cl.[4] ...................... H01L 29/78; H01L 27/14
[52] U.S. Cl. ................................ 357/23.1; 357/23.12; 357/29; 357/52; 357/30; 250/338; 250/370
[58] Field of Search ............... 357/29, 23.1, 52, 23.12, 357/30; 250/338 SE, 370 K, 370 E

[56]  References Cited
U.S. PATENT DOCUMENTS

| 3,742,215 | 6/1973 | Mueleman | 357/29 |
| 4,251,829 | 2/1981 | Adam | 357/23 |
| 4,276,095 | 6/1981 | Beilstein, Jr. et al. | 148/1.5 |
| 4,307,411 | 12/1981 | Carnes et al. | 357/23 |
| 4,356,040 | 10/1982 | Fu et al. | 148/1.5 |
| 4,420,871 | 12/1983 | Scheibe | 357/59 |
| 4,472,729 | 9/1984 | Shibata et al. | 357/59 |
| 4,505,024 | 3/1985 | Kawata et al. | 357/23.1 |
| 4,511,799 | 4/1985 | Bjorkholm | 250/374 |
| 4,529,884 | 7/1985 | Wolicki et al. | 250/370 E |

Primary Examiner—Martin H. Edlow
Assistant Examiner—Jerome Jackson, Jr.
Attorney, Agent, or Firm—Paul F. McCaul; John R. Manning; Thomas H. Jones

[57] ABSTRACT

A MOSFET structure having a biased gate covered with an insulator of such a thickness as to render the structure capable of giving a measure of accumulated charge and usable in a stacked structure as a particle spectrometer.

8 Claims, 5 Drawing Figures

FET CHARGE SENSOR AND VOLTAGE PROBE

ORIGIN OF THE INVENTION

The invention described herein was made in the performance of work under a NASA Contract and is subject to the provisions of Section 305 of the National Aeronautics and Space Act of 1958, Public Law 85-568 (72 STAT 435; 43 USC 2457).

BACKGROUND OF THE INVENTION

Field of the Invention

The subject invention relates to charge or voltage sensors and particularly to an improved sensor employing semiconductor device technology.

In the prior art, monitoring of spacecraft surface voltages, high energy environments, or internal charges within dielectrics and insulators has required heavy, complicated electronics and sensors. Power demands of such equipment are also high, presenting an additional obstacle to spacecraft use.

SUMMARY OF THE INVENTION

It is therefore an object of the invention to provide an improved voltage/charge sensor.

It is another object of the invention to provide a simplified, low power voltage/charge sensor.

It is yet another object of the invention to provide a charge sensor employing solid state technology.

The foregoing and other objects are achieved according to the invention by a field effect transistor (FET) structure having a biased gate formed within an insulator much thicker than the insulator provided by a typical FET passivating layer. Charges incident upon the thick insulator are accumulated and modulate conduction between the FET's source and drain. The modulation may be detected by imposing it on a source-to-drain current or other signal to provide a measure of the amount of charge accumulated on the gate insulator. Several such sensors having different gate materials and/or insulator thicknesses may be stacked to provide a particle spectrometer.

BRIEF DESCRIPTION OF THE DRAWINGS

The just-summarized invention will now be described in conjunction with the drawings of which.

DETAILED DESCRIPTION OF THE PREFERRED EMBODIMENT

Figure 1:
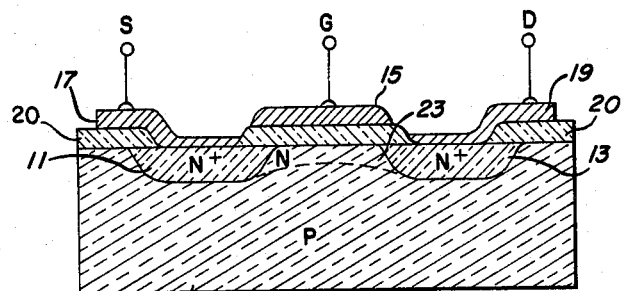
FIG. 1 illustrates a cross-section of a prior art n-channel MOSFET transistor.

FIG. 1 is a representation of a prior art n-channel MOSFET transistor. Two N+ islands 11, 13 are diffused in a P substrate between a gate 15 and the two source and drain structures 17, 19. An electric potential applied to the gate 15 will affect the conduction of majority carrier charges between the source 17 and the drain 19. This electric potential causes a conduction channel 23 to be induced in the P substrate 21 between the heavily doped N+ islands 11, 13.

By choice of gate bias, the conductivity of the channel 23 can be either enhanced or depleted. Signals superimposed on the gate bias voltage cause proportional changes in channel conductivity.

If an N-doped substrate 21 is used, with heavily-doped P islands 11, 13, a P-channel MOSFET is formed. Operation is the same in principle as the N-channel case, but with opposite polarities. Both N and P type MOSFETS are normally used as amplifiers, or as switches, responsive to signals applied to the metallic gate 15.

Figure 2:
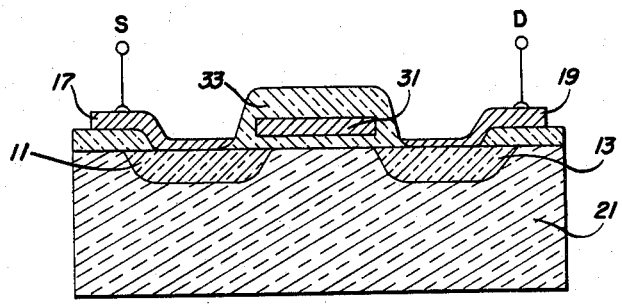
FIG. 2 illustrates a cross-section of a charge sensor according to the preferred embodiment.

In prior art MOSFETs the transistor is covered with a thin passivating layer (not shown), which is actually an insulator, typically of a nominal thickness of about 1 micron. In the instant invention, illustrated schematically in FIG. 2, the gate 31 is surrounded by an insulator 33 of a thickness two to ten times the nominal thickness of the passivating layer of FIG. 1. The insulation on the gate 31 is built up to the thickness required to accumulate the desired charges (passivation being applied to the rest of the transistor in the usual fashion). Thus, in FIG. 2, the metal gate 31 is not connected to a signal source, but is biased for operation in either the enhancement or depletion mode, as desired. Charge accumulation within the insulator 33 will change the channel conductivity proportionally. This conductivity may be sampled intermittently to measure the charge accumulation.

To prevent discharge of the accumulated charges through the gate bias supply, the gate 31 may be isolated by very-low-leakage blocking diodes. When the sampling interval is over, the gate 31 can be "pulled down" (or "up," depending on mode) to cause the accumulated charge to discharge, and so begin another sampling interval. In strong fields, the gate 31 can be left floating, so that it has no imposed bias value, but takes on the potential of the charges in the insulator 33 as they accumulate. The mode of operation will be determined by the polarity of the charges on the lower surface of the insulator 33.

As the charge accumulates, the gate potential will change from its initial zero value, and source-to-drain conductivity will be modulated by the accumulated charges, to the final value. The metal gate 31 can be reconnected for discharge and for checking of operation and calibration. Thus, in the preferred embodiment, the gate insulator 33 operates as the control structure, serving as a virtual, or dielectric gate. The metallic gate 31 serves only as the sample/reset device.

Figure 3:
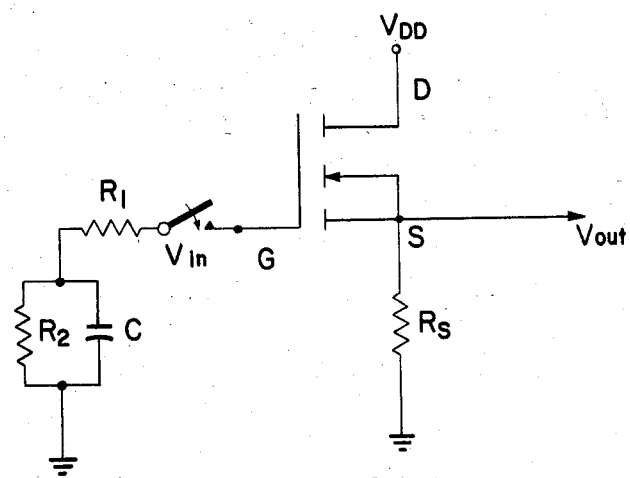
FIG. 3 illustrates a schematic of the charge sensor of FIG. 2 in a sampling configuration.
Figure 4:
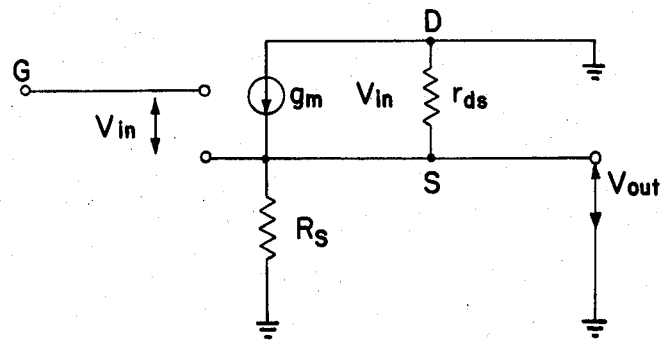
FIG. 4 illustrates an equivalent circuit of FIG. 3.

FIG. 3 illustrates a schematic of the preferred embodiment in a sampling mode. FIG. 4 illustrates an equivalent circuit model based on the assumptions $|v_{DS}| \leq |v_{GS} - v_T|$ and $v_{DS} < 0$; $v_{GS} < 0$. The various parameters in these circuits are defined according to the following definitions:

$v_{in} \equiv$ voltage (with respect to ground) of floating gate
$v_{out} \equiv$ measurable voltage at source (low impedance)
$v_{GS} \equiv$ voltage between gate and source
$v_{in} = (v_{out}/A_V)$
$V_T =$ threshold voltage $$A_V \equiv \text{voltage gain} = \frac{g_m(r_{ds} \| R_s)}{1 + g_m(r_{ds} \| R_s)}$$

$$g_m \equiv \text{transconductance} = \frac{\partial I_D}{\partial V_G}\bigg|_{V_D = \beta v_{DS}}$$

-continued $$\beta = \left(\frac{\omega}{L}\right)\left(\frac{\epsilon_{ox}\mu_n}{t_{ox}}\right)$$

$$\mu_n = \text{electron mobility}\left(\text{negative value in }\frac{cm^2}{V_{sec}}\right)$$

$r_{ds}$=drain resistance, saturation region
$R_s$=source resistance $$r_{ds}\|R_s = \frac{R_s r_{ds}}{R_s + r_{ds}}$$

$v_{DS}$=voltage between drain and source
W=channel width
L=channel length
$\epsilon_{ox}$=oxide dielectric constant (permittivity)
$t_{ox}$=oxide thickness $$V_T = \frac{-Q_{SS} + Q_D}{C}$$

$Q_{SS}$=effective surface-state charge density per unit area
$Q_D$=bulk charge per unit area associated with channel depletion region
C=capacitance of the gate to channel per unit area
$R_2$=Internal resistance of the semiconductor device
$R_1$=Resistance of the external circuit used in the sampling process In any particular design, the parameters of the device which are not fixed by geometry are set to properly interface the device output to a selected spacecraft system.

The MOSFET device of the preferred embodiment (FIG. 2) may be placed inside a larger insulator for the purpose of measuring a high-energy field—or the behavior of an insulating material in that field. Being capable of a high degree of miniaturization, the MOSFET of FIG. 2 can act almost as a point-sized detector for field mapping. The MOSFET can be embedded in the outer surface of a spacecraft, with its gate structure acting as a sample area in the skin, in order to monitor spacecraft surface charge, etc. It can also be set against the inner surface of the skin, to measure particle penetration through the skin.

Figure 5:
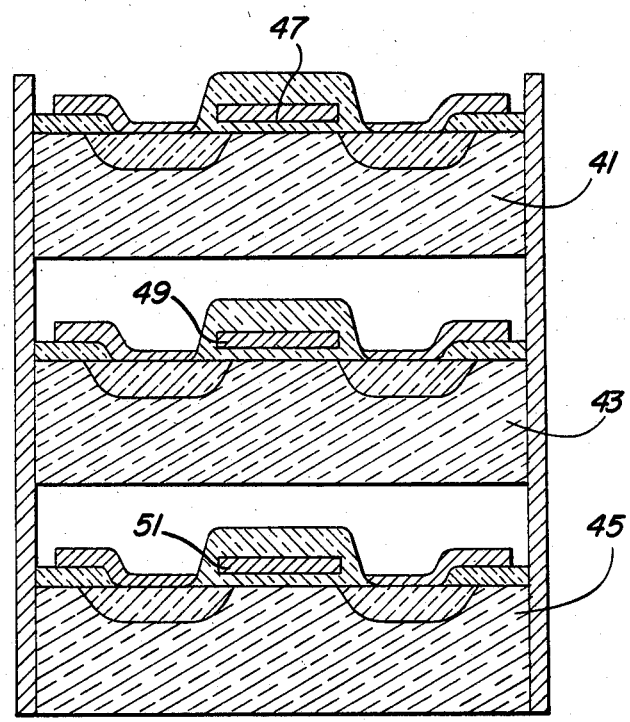
FIG. 5 illustrates a cross-section of a particle spectrometer according to the preferred embodiment.

By controlling the types and thicknesses of the gate structures 31, 33, a particle spectrometer can be built by stacking several MOSFETs. FIG. 5 shows a schematic cross-sectional view of one possible arrangement including three MOSFET transistors 41, 43, 45 constructed according to FIG. 2. The top transistor 41 is made with an aluminum gate 47 for trapping low-energy charges. The second MOSFET 43 in the stack uses an iron gate 49, and traps medium-energy particles, while the third MOSFET 45 uses a gold gate 51 for trapping high-energy particles. All gates 47, 49, 51 are allowed to float during sampling. Limited only by the transparency of the substrate and insulators to the particle beam, the stack of FIG. 5 may be provided with a large number of layers and resultant higher resolution. Separate short stacks of devices may be used for the lower-energy end of the spectrum to avoid having too many layers of MOSFETs, which may result in erroneous accumulations in the lower levels. Since each device provides some shielding and thus removes electrons from the beam, stacks may be fabricated with identical layers using the same metals, for finer gradations.

As is apparent, the just-described embodiments are subject to numerous modifications and adaptations without departing from the scope and spirit of the invention. Therefore, it is to be understood that, within the scope of the appended claims, the invention may be practiced other than as specifically described herein.

What is claimed is:

1. A voltage/charge sensor device for accumulating charges to be measured in an electric field, said sensor comprising
   a first field effect transistor structure having a passivating overlay, a biased metal gate electrode and an inducible conducting channel between source-to-drain electrodes; and
   a first modulating means accumulating a charge to be measured for modulating the source-to-drain conductivity in accordance with the charges that are accumulated;
   said modulating means characterized by including
      a first insulating layer that is a multiple of thicknesses greater than said passivating layer; and
      said first layer surrounding only said metal gate electrode and also coming into contact with said conductive channel.

2. The sensor device of claim 1 and further comprising:
   at least a second field effect transistor structure like the first and having a passivating overlay, a biased metal gate electrode and an inducible conducting channel between source-to-drain electrodes;
   a second modulating means accumulating a charge to be measured for modulating the source-to-drain conductivity of said second transistor in accordance with the charges that are accumulated;
   said second modulating means characterized by including
      a second insulating layer that is a multiple of thicknesses greater than said passivating overlay of said second field effect transistor;
      said second layer surrounding only said second gate electrode and also coming into contact with said second conductive channel;
      means forming a particle spectrometer by spacing and maintaining said second transistor structure being separate and apart from said first transistor structure and positioned one above the other.

3. The sensor device of claim 1 wherein each transistor structure has connected thereto means for sampling the channel conductivity to provide a measure of the accumulated charge.

4. The sensor device of claim 1 wherein said gate is biased in the enhancement mode.

5. The sensor device of claim 1 wherein said gate is biased in the depletion mode.

6. The sensor device of claim 2 wherein each transistor structure has connected thereto means for sampling the channel conductivity to provide a measure of the accumulated charge.

7. A plurality of voltage/charge sensor devices stacked one over each other to form a particle spectrometer and comprising
   a first voltage/charge sensor device located at an upper layer of said stack, and including a first field effect transistor structure having a passivating overlay, a biased aluminum gate electrode and a first inducible conducting channel between source-to-drain electrodes; and a first modulating means accumulating a low-energy charge to be measured for modulating the source-to-drain conductivity in accordance with the low-energy charges that is accumulated;

said first modulating means characterized by including a first insulating layer that is a multiple of thicknesses greater than said passivating layer;

said first insulating layer surrounding only said aluminum gate electrode and also coming into contact with said first conductive channel;

a second voltage/charge sensor device located under said first in said stack, and including a second field effect transistor structure having a passivating overlay, a biased iron gate electrode and a second inducible conducting channel between source-to-drain electrodes;

a second modulating means accumulating a medium-energy charge to be measured for modulating the source-to-drain conductivity of said second transistor in accordance with the medium-energy charge that is accumulated;

said second modulating means characterized by including a second insulating layer that is a multiple of thicknesses greater than said passivating overlay of said second field effect transistor;

aid second layer surrounding only said iron gate electrode and also coming into contact with said second conductive channel;

a third voltage/charge sensor located as a third layer of said stack, and including a third field effect transistor structure having a passivating overlay A biased gold gate electrode and a third inducible comducting channel between source-to-drain electrodes; and a third modulating means identical to said first or second modulating means for accumulating high-energy charge to be measured for modulating the source-to-drain conductivity of said third transistor in accordance with the high-energy charge that is accumulated.

8. The particle spectrometer of claim 7 wherein each transistor structure further comprises in combination means for sampling the channel conductivity to provide a measure of the low, medium and high energy charges accumulated by said first, second and third modulating means.

* * * * *